US012616008B2

(12) United States Patent
Fan

(10) Patent No.: US 12,616,008 B2
(45) Date of Patent: Apr. 28, 2026

(54) INVERTING WAFER AND ETCHING BACK PLANE TO EXPOSE CONDUCTIVE PILLARS FROM BACK PLANE OF WAFER FOR FURTHER PROCESSING

(71) Applicant: CHANGXIN MEMORY TECHNOLOGIES, INC., Hefei City (CN)

(72) Inventor: Zengyan Fan, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 531 days.

(21) Appl. No.: 18/168,899

(22) Filed: Feb. 14, 2023

(65) Prior Publication Data

US 2024/0096700 A1 Mar. 21, 2024

(30) Foreign Application Priority Data

Sep. 15, 2022 (CN) .......................... 202211131627.1

(51) Int. Cl.
*H10W 20/00* (2026.01)
*H10P 52/40* (2026.01)
(Continued)

(52) U.S. Cl.
CPC ......... *H10W 20/023* (2026.01); *H10W 20/20* (2026.01); *H10W 74/137* (2026.01);
(Continued)

(58) Field of Classification Search
CPC ........... H01L 21/76898; H01L 23/3171; H01L 23/3192; H01L 23/481; H01L 24/13;
(Continued)

(56) References Cited

U.S. PATENT DOCUMENTS 6,573,191 B1 * 6/2003 Komiya .............. H01L 21/0212
257/E21.259
7,214,615 B2 * 5/2007 Miyazawa .............. H01L 24/13
257/E21.597
(Continued)

FOREIGN PATENT DOCUMENTS

CN 104952720 A 9/2015

*Primary Examiner* — Herve-Louis Y Assouman
(74) *Attorney, Agent, or Firm* — Syncoda LLC; Feng Ma

(57) ABSTRACT

A semiconductor structure, a method for preparing the semiconductor structure and a memory are provided. The method includes: providing a wafer in which multiple conductive pillars are formed; inverting the wafer and performing etching on a back plane of the wafer to expose each conductive pillar from the back plane of the wafer, and lengths of the multiple conductive pillars exposed to the back plane are different; depositing an insulation layer on the back plane of the wafer and the conductive pillars, and depositing a filling layer on the insulation layer, the filling layer completely covering back ends of the multiple conductive pillars; and performing polishing on the filling layer and back ends of a part of the conductive pillars, until a back end of each conductive pillar is exposed and the back ends of the multiple conductive pillars are flush with a back plane of the filling layer.

14 Claims, 6 Drawing Sheets

S11

A wafer in which multiple conductive pillars are formed is provided

S12

The wafer is inverted and etching is performed on a back plane of the wafer to expose each conductive pillar from the back plane of the wafer, in which lengths of the multiple conductive pillars exposed to the back plane are different

S13

An insulation layer is deposited on the back plane of the wafer and the conductive pillars, and a filling layer is deposited on the insulation layer, in which the filling layer completely covers back ends of the multiple conductive pillars

S14

Polishing is performed on the filling layer and back ends of a part of the conductive pillars, until a back end of each conductive pillar is exposed and the back ends of the multiple conductive pillars are flush with a back plane of the filling layer

(51) Int. Cl.
| | |
|---|---|
| *H10P 95/00* | (2026.01) |
| *H10W 20/20* | (2026.01) |
| *H10W 72/20* | (2026.01) |
| *H10W 74/10* | (2026.01) |
| *H10W 74/43* | (2026.01) |

(52) U.S. Cl.
CPC ......... *H10W 74/147* (2026.01); *H10P 52/403* (2026.01); *H10P 95/062* (2026.01); *H10W 72/244* (2026.01); *H10W 72/248* (2026.01); *H10W 74/43* (2026.01)

(58) Field of Classification Search
CPC ........... H01L 21/31053; H01L 21/3212; H01L 23/291; H01L 24/14; H01L 2224/13025; H01L 2224/14181; H01L 21/7684; H01L 23/3114; H01L 2221/68327; H01L 21/6835
See application file for complete search history.

(56) References Cited

U.S. PATENT DOCUMENTS

| | | | |
|---|---|---|---|
| 2014/0035109 A1* | 2/2014 | Volant | H01L 21/76802 257/621 |
| 2014/0151895 A1* | 6/2014 | West | H01L 23/481 257/774 |
| 2015/0048519 A1* | 2/2015 | Park | H10D 89/013 257/774 |

\* cited by examiner

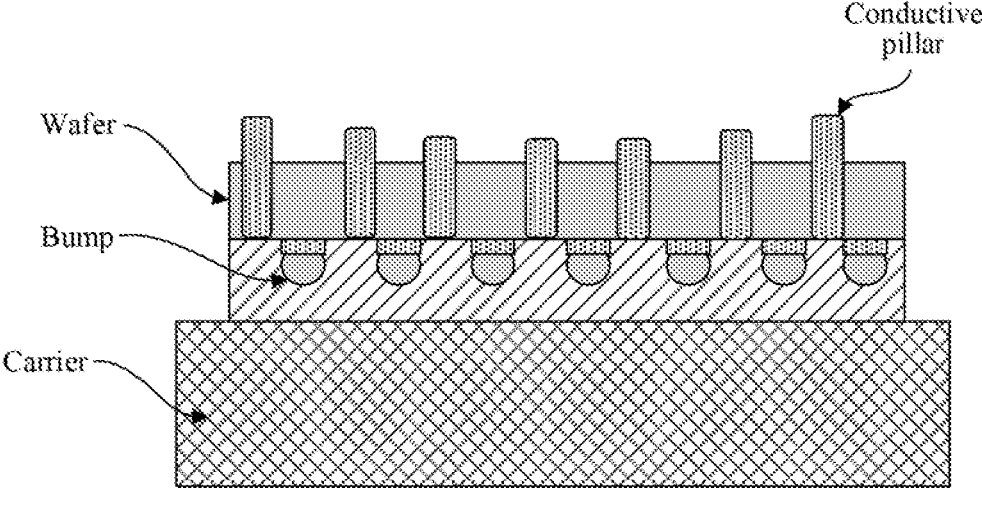

A wafer in which multiple conductive pillars are formed is provided

S12

The wafer is inverted and etching is performed on a back plane of the wafer to expose each conductive pillar from the back plane of the wafer, in which lengths of the multiple conductive pillars exposed to the back plane are different

S13

An insulation layer is deposited on the back plane of the wafer and the conductive pillars, and a filling layer is deposited on the insulation layer, in which the filling layer completely covers back ends of the multiple conductive pillars

S14

Polishing is performed on the filling layer and back ends of a part of the conductive pillars, until a back end of each conductive pillar is exposed and the back ends of the multiple conductive pillars are flush with a back plane of the filling layer

FIG. 2

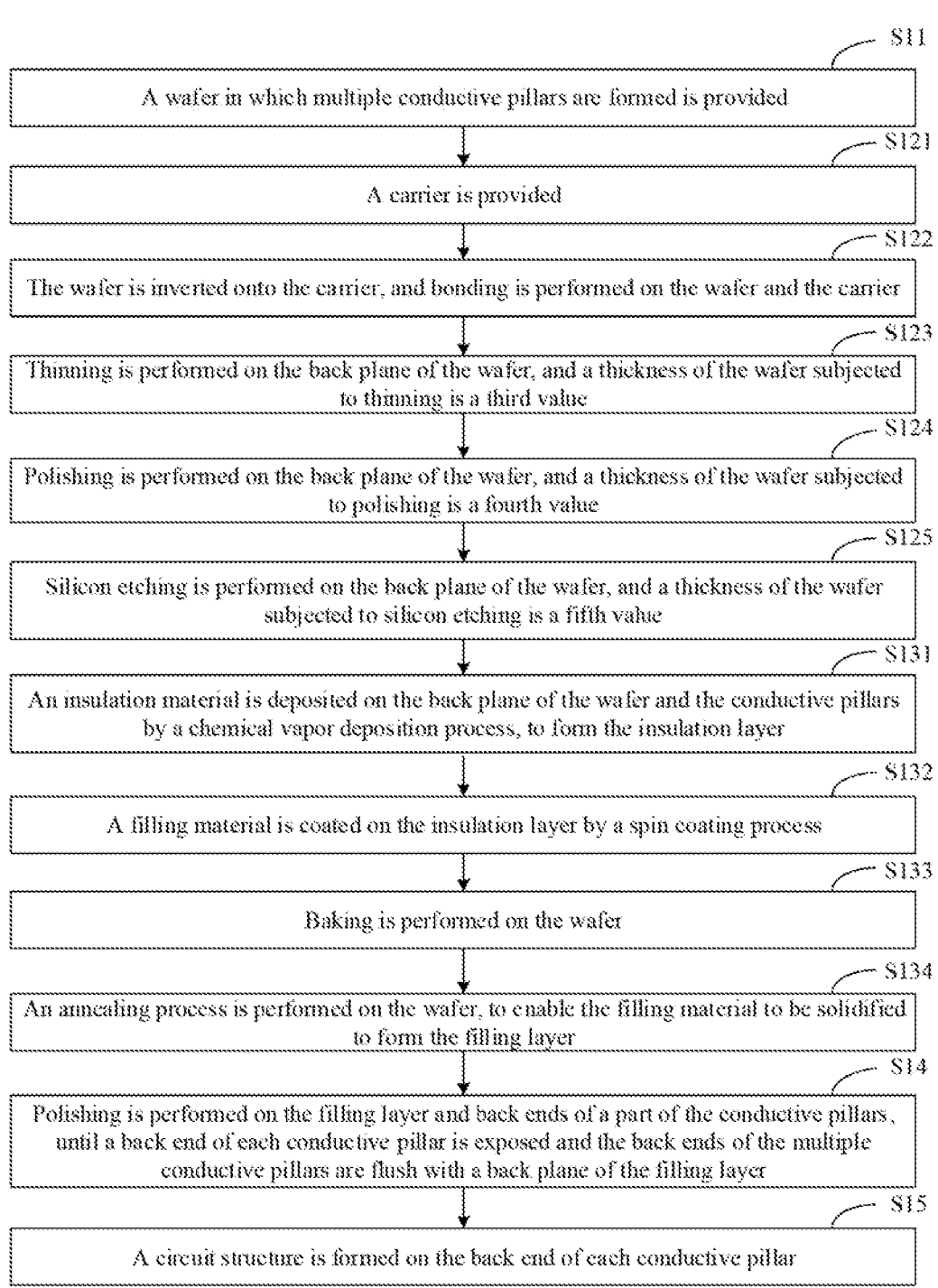

A wafer in which multiple conductive pillars are formed is provided                    S11

A carrier is provided                    S121

The wafer is inverted onto the carrier, and bonding is performed on the wafer and the carrier                    S122

Thinning is performed on the back plane of the wafer, and a thickness of the wafer subjected to thinning is a third value                    S123

Polishing is performed on the back plane of the wafer, and a thickness of the wafer subjected to polishing is a fourth value                    S124

Silicon etching is performed on the back plane of the wafer, and a thickness of the wafer subjected to silicon etching is a fifth value                    S125

An insulation material is deposited on the back plane of the wafer and the conductive pillars by a chemical vapor deposition process, to form the insulation layer                    S131

A filling material is coated on the insulation layer by a spin coating process                    S132

Baking is performed on the wafer                    S133

An annealing process is performed on the wafer, to enable the filling material to be solidified to form the filling layer                    S134

Polishing is performed on the filling layer and back ends of a part of the conductive pillars, until a back end of each conductive pillar is exposed and the back ends of the multiple conductive pillars are flush with a back plane of the filling layer                    S14

A circuit structure is formed on the back end of each conductive pillar                    S15

FIG. 3

Before solidifying              After solidifying

1

INVERTING WAFER AND ETCHING BACK PLANE TO EXPOSE CONDUCTIVE PILLARS FROM BACK PLANE OF WAFER FOR FURTHER PROCESSING

CROSS-REFERENCE TO RELATED APPLICATION

This application claims priority to Chinese Patent Application No. 202211131627.1, filed on Sep. 15, 2022, the disclosure of which is hereby incorporated by reference in its entirety.

TECHNICAL FIELD

The present disclosure relates to the technical field of a semiconductor, and relates to, but is not limited to, a semiconductor structure, a method for preparing the semiconductor structure and a memory.

BACKGROUND

With the development of semiconductor technology, a feature dimension of integrated circuits continues to shrink and a density of device interconnection continues to increase. Traditional two-dimensional packaging no longer meets the requirements of industry, while a stacked packaging based on Through Silicon Via (TSV) vertical interconnection gradually becomes the development trend of packaging technology because of its key technical advantages of short-distance interconnection and high-density integration.

In a TSV Middle technology, it is necessary to reveal a backside of the TSV in a chip by means of Backside Via Reveal (BVR), so as to realize the multi-layer stacking and interconnection of the chip. However, in a process of etching to form the TSV, different TSVs have different depths due to the etching process, so revealed backside lengths of different TSVs are different, which brings negative effects to the subsequent process.

SUMMARY

The present disclosure relates to the technical field of a semiconductor. Embodiments of the present disclosure provide a semiconductor structure, a method for preparing the semiconductor structure and a memory.

According to a first aspect, the embodiments of the present disclosure provide a method for preparing a semiconductor structure, which includes the following operations.

A wafer in which multiple conductive pillars are formed is provided.

The wafer is inverted and a back plane of the wafer is etched to expose each conductive pillar from the back plane of the wafer. Lengths of the multiple conductive pillars exposed to the back plane are different.

An insulation layer is deposited on the back plane of the wafer and the conductive pillars, and a filling layer is deposited on the insulation layer. The filling layer completely covers back ends of the multiple conductive pillars.

Polishing is performed on the filling layer and back ends of a part of the conductive pillars, until a back end of each conductive pillar is exposed and the back ends of the multiple conductive pillars are flush with a back plane of the filling layer.

According to a second aspect, the embodiments of the present disclosure provide a semiconductor structure, which includes a wafer, an insulation layer and a filling layer.

A plurality of conductive pillars are formed in the wafer.

The insulation layer is formed on a back plane of the wafer.

The filling layer is formed on a back plane of the insulation layer.

A back end of each conductive pillar is exposed from a back plane of the filling layer and is flush with the back plane of the filling layer.

According to a third aspect, the embodiments of the present disclosure provide a memory, which includes the semiconductor structure as described in the second aspect.

In the embodiments of the present disclosure, the revealed part of the conductive pillars is protected by the filling layer, which not only avoids the conductive pillars being torn in the subsequent polishing process, but also avoids the wafer being polluted with the polished-down conductive material. Meanwhile, after polishing is performed, the back ends of all conductive pillars are exposed from the back plane of the filling layer, and the heights of the back ends of all conductive pillars are the same, which reduces the difficulty of subsequent interconnection process and improves the preparation yield of the semiconductor structure.

BRIEF DESCRIPTION OF THE DRAWINGS

In the accompanying drawings (which are not necessarily drawn to scale), similar reference numerals may describe similar components in different views. Various embodiments discussed in the disclosure are illustrated by way of example and are not limited in the accompanying drawings.

FIG. 1 is a schematic diagram of a wafer structure after BVR process.

FIG. 2 is a schematic flowchart of a method for preparing a semiconductor structure according to an embodiment of the present disclosure.

FIG. 3 is a schematic flowchart of another method for preparing a semiconductor structure according to an embodiment of the present disclosure.

DESCRIPTION OF REFERENCE NUMERALS

Figure 4A:
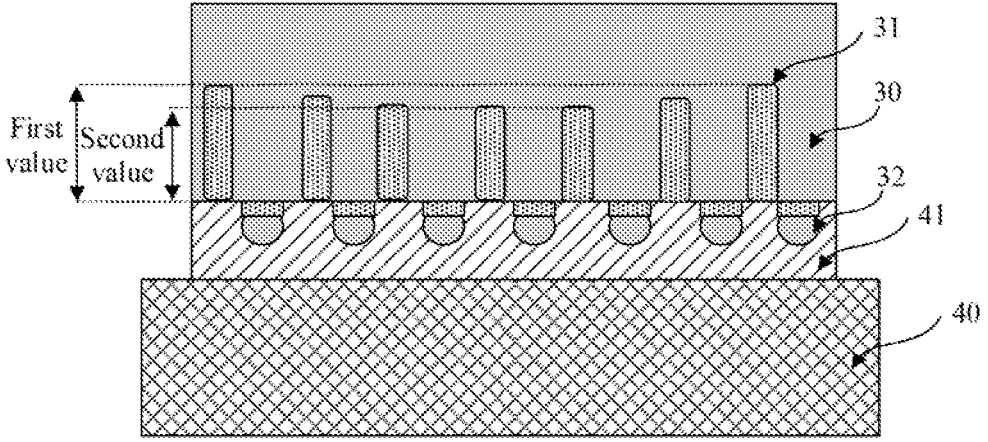
FIG. 4A is a first schematic diagram of a preparation process of a semiconductor structure according to an embodiment of the present disclosure.

30—wafer; 31—conductive pillar; 32—bump; 33—insulation layer, 34—filling layer, 35—circuit structure; 40—carrier; 41—bonding epoxy; 50—semiconductor structure; 60—memory.

DETAILED DESCRIPTION

Exemplary implementations disclosed in embodiments of the disclosure are described in detail below with reference to the accompanying drawings. Although the accompanying drawings illustrate the exemplary implementations of the disclosure, it should be understood that the embodiments of the disclosure can be implemented in various forms, and should not be limited by the particular implementations described herein. On the contrary, the purpose of providing these implementations is to more thoroughly understand the embodiments of the disclosure, and the scope of the disclosure of the embodiments of the disclosure is fully conveyed to those skilled in the art.

In the following description, numerous details are provided for providing a more thorough understanding of the disclosure. However, it would be apparent to those skilled in the art that the embodiments of the disclosure can be implemented without one or more of these details. In other examples, in order to avoid confusion with the disclosure, some technical features known in the art are not described. That is, not all features of actual embodiments are described herein, and well-known functions and structures are not described in detail.

In the accompanying drawings, for clarity, the sizes of layers, areas and elements and their relative sizes may be exaggerated. Like reference numerals refer to like elements throughout.

It should be understood that when an element or layer is referred to as being "on", "adjacent to", "connected to" or "coupled to" other elements or layers, it can be directly on, adjacent to, connected to or coupled to the other elements or layers, or intervening elements or layers may be present. In contrast, when an element is referred to as being "directly on", "directly adjacent to", "directly connected to" or "directly coupled to" other elements or layers, intervening elements or layers are absent. It should be understood that although the terms first, second, third, etc., may be used to describe various elements, components, areas, layers and/or portions, those elements, components, areas, layers and/or portions may not be limited by these terms. The terms are merely used to distinguish one element, component, area, layer or portion from another element, component, area, layer or portion. Thus, a first element, component, area, layer or portion discussed below may be referred to as a second element, component, area, layer or portion without departing from the teachings of the disclosure. Moreover, when a second element, component, area, layer or portion is discussed, it does not mean that a first element, component, area, layer or portion is necessarily present in the disclosure.

The terms used herein is for the purpose of describing particular embodiments only and is not intended to limit the disclosure. As used herein, the singular forms "a", "an" and "said/the" are intended to include the plural forms as well, unless the context clearly indicates otherwise. It should be further understood that the terms "comprises" and/or "comprising", when used in this specification, the presence of the features, integers, steps, operations, elements, and/or components is determined, but the presence or addition of one or more other features, integers, steps, operations, elements, components, and/or groups thereof is not precluded. As used herein, the term "and/or" includes any and all combinations of one or more of the associated listed items.

TSVs may be used in the packaging field of three-dimension-Dynamic Random Access Memory (DRAM). Specifically, the DRAM may adopt a process of TSV Middle (i.e., forming TSVs in the middle step) to form the TSVs in a wafer, and then reveal the TSVs from a back plane of the wafer through the BVR process, so as to form micro pads in the revealed part for achieving the multi-layer stacking and interconnection of the chip in the subsequent processes.

That is, in the three-dimensional stacking structure, the front-back sides of adjacent chips are stacked and interconnected with each other, and the chips need to reveal TSVs from a back plane of a wafer by means of BVR. FIG. 1 illustrates a schematic diagram of a wafer structure after BVR process. As illustrated in FIG. 1, a front side (front surface) of the wafer is bonded to a carrier, so that the back plane of the wafer is upward. Meanwhile, there are many conductive pillars inside the wafer (conductive pillars are the structural name of TSVs), and there are other packaging bumps on the front side of the wafer, which are used for realizing other types of interconnection.

However, in a process of forming conductive pillars by etching, due to the characteristics of the etching process, heights of the etch holes at the edge of the wafer are generally high, while heights of the etch holes in the middle of the wafer are low, and thus depths of the formed conductive pillars are not the same. For the BVR process, when the etching amount of the backside of the wafer is less, there may be a situation that the conductive pillars at the edge of the wafer are exposed, but the conductive pillars in the middle of the wafer are not exposed. When the etching amount of the backside of the wafer is large, it may cause the conductive pillars at the edge of the wafer to be too high, which is easy to tear in the subsequent polishing process, and also brings difficulty to the subsequent interconnection process.

Based on this, the embodiments of the present disclosure provide a semiconductor structure. In the BVR process, the revealed part of the conductive pillars is protected by the filling layer, which not only avoids the conductive pillars being torn in the subsequent polishing process, but also avoids the wafer being polluted with the polished-down conductive material. Meanwhile, after polishing is performed, back ends of all conductive pillars are exposed from the back plane of the filling layer, and the heights of the back ends of all conductive pillars are the same, which reduces the difficulty of subsequent interconnection process and improves the preparation yield of the semiconductor structure.

In an embodiment of the present disclosure, FIG. 2 illustrates a schematic flowchart of a method for preparing a semiconductor structure according to an embodiment of the present disclosure is illustrated. As illustrated in FIG. 2, the method includes the following operations.

In S11: a wafer in which multiple conductive pillars are formed is provided.

It should be noted that the semiconductor structure according to the embodiments of the present disclosure is applied to a semiconductor device with a three-dimensional architecture, such as a three-dimensional DRAM. Exemplary, the preparation method is specifically used for realizing the BVR process of a TSV Middle process.

A material of the Wafer is silicon (Si), and may also be other semiconductor elements, such as, germanium (Ge), or include semiconductor compounds, such as, silicon carbide (SiC), gallium arsenide (GaAs), gallium phosphide (GaP), indium phosphide (InP), indium arsenide (InAs), or indium antimonide (InSb), or other semiconductor alloys, such as, silicon germanium (SiGe), arsenic gallium phosphide (GaAsP), indium aluminum arsenide (AlinAs), gallium aluminum arsenide (AlGaAs), indium gallium arsenide (GaInAs), indium gallium phosphide (GaInP), indium gallium arsenide (GaInAsP), or combinations thereof, which are not specifically limited by the embodiments of the present disclosure.

The conductive pillars in the wafer are TSVs. Before the operation in S11, it is required to form the conductive pillars in the wafer. For example, multiple etch holes are formed in the wafer by the etching process, and then a conductive material (e.g., Cu) is filled into the etch holes to form the conductive pillars. As mentioned above, due to the characteristics of the etching process, depths of these etch holes are not the same, that is, depths of different conductive pillars are not the same.

In S12: the wafer is inverted and etching is performed on a back plane of the wafer to expose each conductive pillar from the back plane of the wafer. Lengths of the multiple conductive pillars exposed to the back plane are different.

It should be noted that, in the three-dimensional stacking architecture, different chips need to be stacked by connecting the front-back sides. Therefore, the conductive pillars in the wafer need to be exposed from the backside of the wafer, and then form bumps, so as to realize interconnection with the conductive pillars at the front side of the next wafer.

Therefore, the back plane of the wafer is etched, so that all the conductive pillars are exposed from the backside of the wafer. However, because the depths of different conductive pillars are not the same, the exposed lengths of conductive pillars are different after the back plane of wafer is etched. Referring to FIG. 1, generally, the exposed lengths of the conductive pillars at the edge of the wafer are greater and the exposed lengths of the conductive pillars at the center of the wafer are less.

In S13: an insulation layer is deposited on the back plane of the wafer and the conductive pillars, and a filling layer is deposited on the insulation layer. The filling layer completely covers back ends of the multiple conductive pillars.

It should be noted that the insulation layer is used to realize side insulation of the conductive pillars, and the filling layer is used to protect the revealed part of the conductive pillars, so as to avoid damage to the conductive pillars in subsequent polishing operations.

In S14: polishing is performed on the filling layer and back ends of a part of the conductive pillars, until a back end of each conductive pillar is exposed and the back ends of the multiple conductive pillars are flush with a back plane of the filling layer.

It should be noted that polishing may also be called as Chemical Mechanical Polishing (CMP). CMP is developed based on chemical polishing and mechanical polishing, which may overcome the disadvantages of chemical polishing only and mechanical polishing only, that is, CMP is a polishing technology that combines the abrasive mechanical polishing and chemical corrosion of polishing solution. When CMP is performed, the wafer needs to be placed on the polishing pad, and the wafer is polished by the polishing head together with the polishing solution. CMP enables the machined surface to realize nanometer-level global flattening and meet the ultra-precision damage-free surface machining of the integrated circuit.

In the embodiments of the present disclosure, the filling layer surrounds the conductive pillars during polishing is performed. On the one hand, the filling layer may protect the conductive pillars from being torn during the polishing process; on the other hand, the filling layer may also isolate the falling conductive material from the wafer material, so as to avoid the wafer (Si) being polluted by the conductive material (such as, Cu).

In this way, the back end of each conductive pillar is exposed through the polishing process, which is convenient for the subsequent circuit manufacturing. Meanwhile, the back ends of all conductive pillars are at the same height, so that the difficulty of subsequent interconnection process is reduced, and the stress concentration will not occur, thereby reducing the preparation difficulty of the semiconductor structure and improving the preparation yield of the semiconductor structure.

Referring to FIG. 4A to FIG. 4H, schematic preparation processes of a semiconductor structure according to an embodiment of the present disclosure are illustrated. The above preparation operations will be described in detail below with reference to FIG. 4A to FIG. 4H.

In some embodiments, as illustrated in FIG. 3, the operation that the wafer is inverted includes the following operations.

In S121: a carrier is provided.

In S122: the wafer is inverted onto the carrier, and bonding is performed on the wafer and the carrier.

It should be noted that, after the operation in S122, referring to FIG. 4A, the wafer 30 is inverted onto the carrier 40, and the wafer 30 and the carrier 40 are bonded by the bonding epoxy 41. The bonding epoxy 41 may be a variety of thermoplastic adhesives, which is not limited by the embodiments of the present disclosure. In particular, in FIG. 4A to FIG. 4H, since the wafer 30 is inverted onto the carrier 40, an upward plane of the wafer 30 is a "back plane of the wafer", and an upward end of the conductive pillar 31 is a "back end of the conductive pillar".

As illustrated in FIG. 4A, the wafer 30 also includes multiple conductive pillars 31 and the lengths (or depths) of the conductive pillars 31 are not the same, that is, heights of the back ends of the conductive pillars 31 are different.

In addition, multiple bumps 32 are provided on the front side of the wafer 30 for realizing other types of connection requirements. The bumps 32 may be staggered with the conductive pillars 31, and then are connected with the conductive pillars 32 through the internal wirings of the chip, so that the number of conductive pillars may be increased without increasing the number of bumps 32, thus reducing the complexity of the process for forming a large number of bumps 32.

It should be noted that, referring to FIG. 4A, before the back plane of the wafer is etched, a maximum length of the conductive pillars is a first value, and a minimum length of the conductive pillars is a second value. In some embodiments, as illustrated in FIG. 3, the operation that etching is performed on the back plane of the wafer to expose each conductive pillar from the back plane of the wafer includes the following operations.

In S123: thinning is performed on the back plane of the wafer, and a thickness of the wafer subjected to thinning is a third value.

Figure 4B:
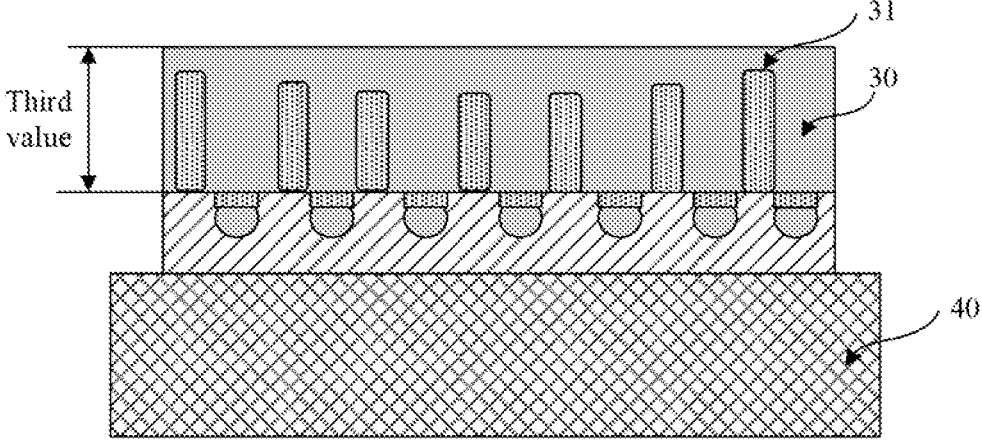
FIG. 4B is a second schematic diagram of a preparation process of a semiconductor structure according to an embodiment of the present disclosure.

It should be noted that, after the operation in S123, referring to FIG. 4B, the thickness of the wafer 30 is changed to the third value, and the third value is greater than the first value, that is, all the conductive pillars 31 are located inside the wafer 30. A variety of processes may be selected for thinning the wafer 30, such as, a mechanical mask, CMP, wet etching, plasma chemical etching, or the like.

In S124: chemical mechanical polishing (CMP) is performed on the back plane of the wafer, and a thickness of the wafer subjected to chemical mechanical polishing is a fourth value.

Figure 4C:
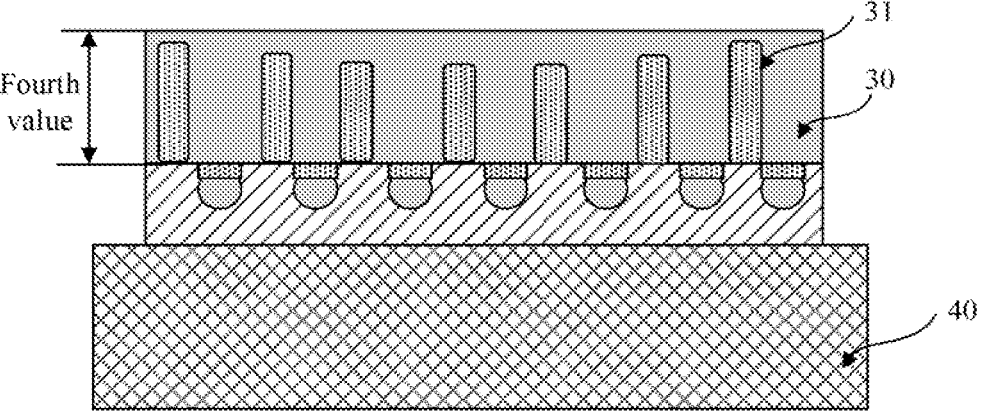
FIG. 4C is a third schematic diagram of a preparation process of a semiconductor structure according to an embodiment of the present disclosure.

It should be noted that, after the operation in S124, referring to FIG. 4C, the thickness of the wafer 30 is changed to the fourth value, and the fourth value is less than the third value and still greater than the first value, that is, all the conductive pillars 31 are still located inside the wafer 30. In this way, the CMP process may make the surface of the wafer 30 smoother and more uniform.

In S125: silicon etching is performed on the back plane of the wafer, and a thickness of the wafer subjected to silicon etching is a fifth value.

Figure 4D:
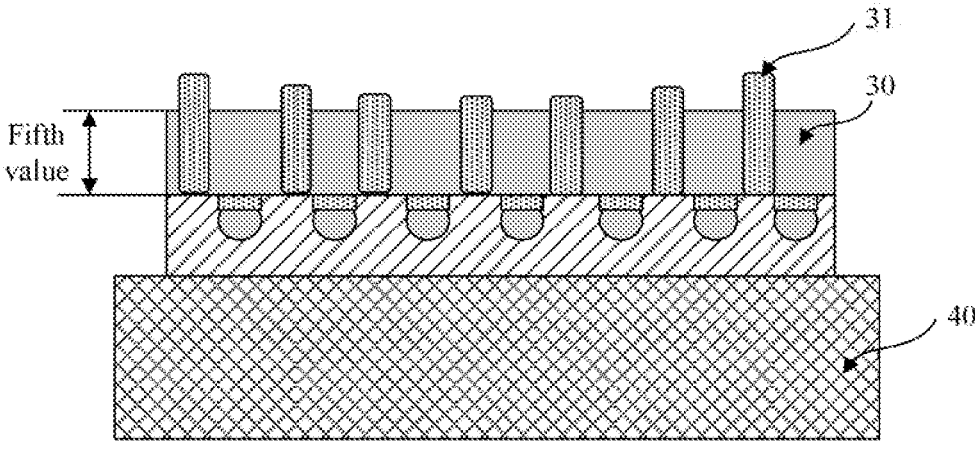
FIG. 4D is a fourth schematic diagram of a preparation process of a semiconductor structure according to an embodiment of the present disclosure.

It should be noted that, after the operation in S125, referring to FIG. 4D, the thickness of the wafer 30 is changed to the fifth value, and the fifth value is less than the second value, that is, all the conductive pillars 31 are exposed from the back plane of the wafer 30.

A difference between the third value and the fourth value is greater than that between the fourth value and the fifth value, that is, a thickness of the wafer thinned in S123 is greater than a thickness of the wafer polished in S124, thereby, through multiple thinning and polishing operations, avoiding influence on the active device. In one example, the third value may be 80 microns, the fourth value may be 65 microns, and the fifth value may be 57 microns. In some embodiments, a difference between the fifth value and the height of the conductive pillar 31 may be between 1-2 microns, thereby ensuring that the wafer has a good thickness and reducing the welding difficulty caused by warping of the wafer due to being too thin.

Silicon etching may adopt wet etching process. By selecting a solution with appropriate etching ratio, only the wafer material is etched without affecting the morphology of conductive pillars.

In other words, the first value is greater than the second value, the third value, the fourth value and the fifth value are decreased successively, the fourth value is greater than the first value, and the fifth value is less than the second value.

In some embodiments, as illustrated in FIG. 3, the operation that the insulation layer is deposited on the back plane of the wafer and the conductive pillars includes the following operations.

In S131: an insulation material is deposited on the back plane of the wafer and the conductive pillars by a chemical vapor deposition process, to form the insulation layer.

Figure 4E:
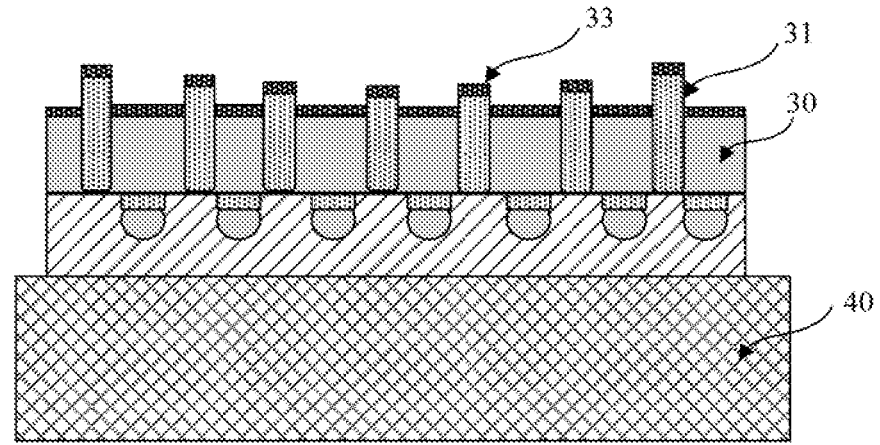
FIG. 4E is a fifth schematic diagram of a preparation process of a semiconductor structure according to an embodiment of the present disclosure.

It should be noted that, after the operation in S131, referring to FIG. 4E, the insulation layer 33 is deposited on the back plane of the wafer 30 and the conductive pillars 31.

It should be noted that, chemical vapor deposition (CVD) refers to a process in which gaseous substances has a chemical reaction on a solid surface at a certain temperature and form a solid deposition film on the solid surface, and has the advantages of high deposition purity and controllable deposition thickness. Here, the insulation material includes at least silicon nitride, and may also be a material with insulating properties, such as, silicon oxide and silicon oxynitride.

It is also to be noted that the thickness of the insulation layer 33 only needs to meet the insulation requirements of the conductive pillars 31.

In some embodiments, the thickness of the insulation layer 33 is less than the minimum length of the conductive pillars 31 exposed to the back plane, and the insulation layer 33 is not deposited on the side surfaces of the conductive pillars 31 (in an actual process, a small amount of insulation material may be deposited on the side surfaces of the conductive pillars 31, which will not affect the subsequent operations), that is, the insulation layer 33 is not continuous, which may reduce the consumption of insulation material and reduce the costs.

In one example, the thickness of the insulation layer 33 may be between 0.2-0.3 microns.

In some embodiments, as illustrated in FIG. 3, the operation that the filling layer is deposited on the insulation layer includes the following operations.

In S132: a filling material is coated on the insulation layer by a spin coating process.

In S133: baking is performed on the wafer.

In S134: an annealing process is performed on the wafer, to enable the filling material to be solidified to form the filling layer.

Figure 4F:
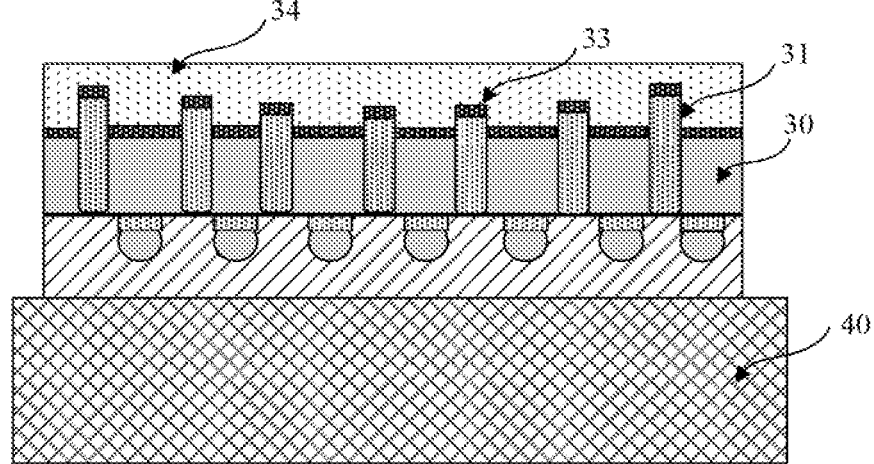
FIG. 4F is a sixth schematic diagram of a preparation process of a semiconductor structure according to an embodiment of the present disclosure.

It should be noted that, after the operation in S134, referring to FIG. 4F, the filling material is spin coated on the insulation layer 33, the filling material is solidified to form the filling layer 34, and the filling layer 34 completely covers the conductive pillars 32. Exemplarily, at the time of initial formation of the filling layer 34, the thickness of the filling layer 34 is about 7.8-8 microns.

Figure 5:
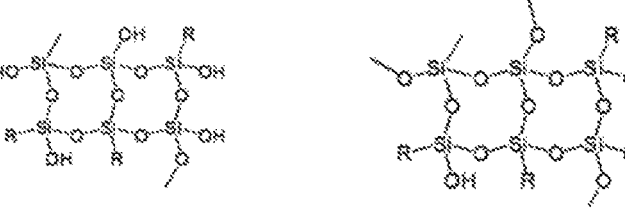
FIG. 5 is a schematic diagram of molecular structures of a spin-on glass material before and after solidifying.

It should be noted that the filling material includes at least SOG. SOG is a liquid dielectric formed by mixing a solvent with a dielectric, and contains silicon dioxide ($SiO_2$) or a material with a structure close to $SiO_2$. SOG is usually used after the CVD process to flatten the deposition layer produced by CVD. SOG has good adhesion to a silicon substrate, silicon nitride deposition layer, silicon oxide deposition layer, ethyl silicate (TEOS), etc., and has strong trench filling ability and good step coverage. After the SOG material is spin coated, the solvent is evaporated by baking and annealing, and the SOG material is solidified and converted into solid $SiO_2$ with low solvent. Referring to FIG. 5, molecular structures of a SOG material before and after solidifying are illustrated.

It should be noted that, for SOG, process parameters of baking are provided for example. The operation that baking is performed on the wafer specifically includes the following operations The wafer is heated to a first temperature value by a hot plate to perform baking for a first preset duration; the wafer is heated to a second temperature value by the hot plate to perform baking for the first preset duration; and the wafer is heated to a third temperature value by the hot plate to perform baking for the first preset duration.

The purpose of the baking is to remove moisture from the SOG, and baking may be performed at several different temperatures to improve the moisture removal efficiency. Specifically, the first temperature value is less than the second temperature value, the second temperature value is less than the third temperature value, and a difference between the second temperature value and the first temperature value is less than that between the third temperature value and the second temperature value.

In one example, the first temperature value is 80° C., the second temperature value is 150° C., the third temperature value is 250° C., and the first preset duration is 3 minutes.

It should also be noted that after the moisture in the SOG is removed, the SOG needs to be solidified by the annealing process. Compared with baking, the annealing process has a higher temperature and longer time. In other words, a temperature of the annealing process is a fourth temperature value and a duration of the annealing process is a second preset duration. The fourth temperature value is greater than the third temperature value, and the second preset duration is longer than the first preset duration.

In one example, the fourth temperature value is 420° C. and the second preset duration is 30 minutes.

Figure 4G:
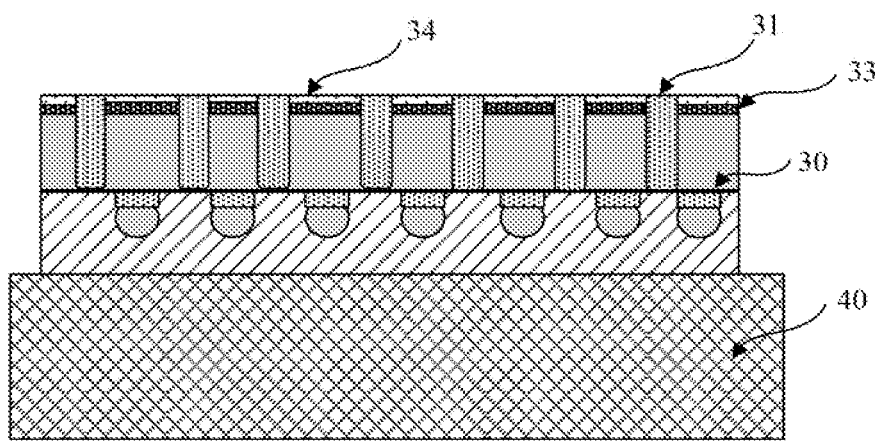
FIG. 4G is a seventh schematic diagram of a preparation process of a semiconductor structure according to an embodiment of the present disclosure.

After the filling layer 34 is formed, the filling layer 34 is subjected to chemical mechanical polishing by the operation in S14, until back ends of all conductive pillars 31 are exposed. Referring to FIG. 4G, the thickness of the filling layer 34 is 0.8-1.2 microns. Here, the material properties of SOG solidified are similar to those of $SiO_2$, and the conventional etching solution and polishing pad may be used in the polishing process.

Figure 6:
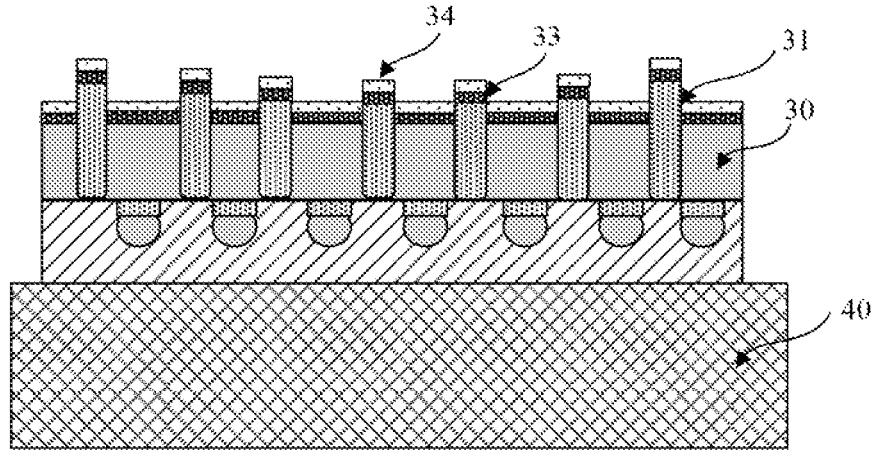
FIG. 6 is a schematic diagram of a preparation process of another semiconductor structure according to an embodiment of the present disclosure.

In particular, the filling layer 34 completely surrounds the conductive pillars 31, thereby increasing the polishing area and avoiding the conductive pillars being torn during the polishing process. As illustrated in FIG. 6, when the filling layer 34 does not surround the conductive pillars 31, the subsequent polishing process will tear the conductive pillars at the edge of the wafer (higher conductive pillars) and affect the performance of the semiconductor structure.

It can be seen from the above that, the thickness of the filling layer is about 7.8-8 microns before polishing is performed on the filling layer 34 and the back ends of the part of the conductive pillars 31; and the thickness of the filling layer is 0.8-1.2 microns after polishing is performed on the filling layer 34 and the back ends of the part of the conductive pillars 31.

In some embodiments, after polishing is performed on the filling layer until the back end of each conductive pillar is exposed, the method also includes the following operations.

In S15: a circuit structure is formed on the back end of each conductive pillar.

It should be noted that, after the operation in S15, referring to FIG. 4H, the circuit structure 35 is formed on the back end of each conductive pillar 31, which is subsequently used for vertical interconnection of different stacked layers.

Figure 4H:
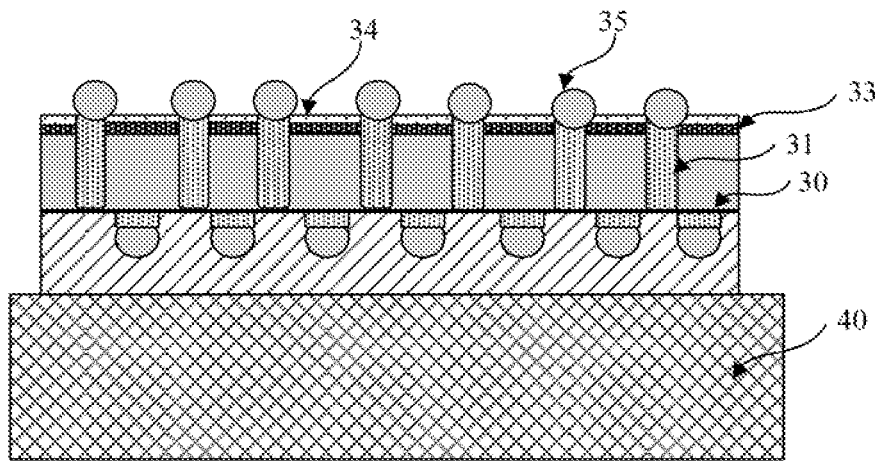
FIG. 4H is an eighth schematic diagram of a preparation process of a semiconductor structure according to an embodiment of the present disclosure.

It can be seen from FIG. 4G and FIG. 4H that, through the method according to the embodiments of the present disclosure, a semiconductor structure with revealed TSVs and the same revealed height can be obtained, so that the difficulty of subsequent interconnection process is reduced, and the problem of stress concentration will not occur, thereby reducing the preparation difficulty of the semiconductor structure and improving the preparation yield of the semiconductor structure.

In some embodiments, the method further includes that debonding is performed on the wafer and the carrier. In other words, the carrier is only temporarily bonded to the wafer to better process the backside of the wafer.

In the foregoing description, all specific material components may be replaced by material components with similar properties, and the above is only an example and not a specific limitation.

The embodiments of the disclosure provide a method for preparing a semiconductor structure, which includes the following operations. A wafer in which multiple conductive pillars are formed is provided. The wafer is inverted and a back plane of the wafer is etched to expose each conductive pillar from the back plane of the wafer, and lengths of the multiple conductive pillars exposed to the back plane are different. An insulation layer is deposited on the back plane of the wafer and the conductive pillars, and a filling layer is deposited on the insulation layer, in which the filling layer completely covers back ends of the multiple conductive pillars. Polishing is performed on the filling layer and back ends of a part of the conductive pillars, until a back end of each conductive pillar is exposed and the back ends of the multiple conductive pillars are flush with a back plane of the filling layer. In this way, the revealed part of the conductive pillars is protected by the filling layer, which not only avoids the conductive pillars being torn in the subsequent polishing process, but also avoids the wafer being polluted with the polished-down conductive material. Meanwhile, the embodiments of the present disclosure may obtain the conductive pillars with the same revealed height, so that the management and control of the BVR process is simple, the difficulty of subsequent interconnection process is reduced and the preparation yield of the semiconductor structure is improved.

Figure 7:
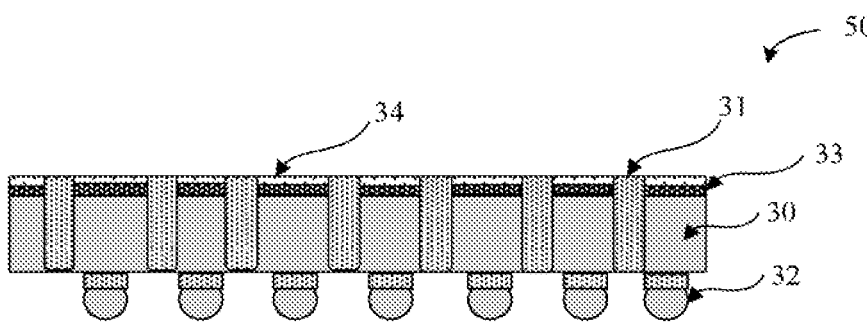
FIG. 7 is a schematic diagram of a semiconductor structure according to an embodiment of the present disclosure.

In an embodiment of the present disclosure, FIG. 7 illustrates a schematic diagram of a semiconductor structure 50 according to an embodiment of the present disclosure. As illustrated in FIG. 7, the semiconductor structure 50 includes a wafer 30, an insulation layer 33 and a filling layer 34.

Multiple conductive pillars 31 are formed in the wafer 30. The insulation layer 33 is formed on a back plane of the wafer 30. The filling layer 34 is formed on a back plane of the insulation layer 33. A back end of each conductive pillar 31 is exposed from the back plane of the filling layer 34 and is flush with the back plane of the filling layer 34.

It should be noted that the semiconductor structure 50 may be applied to three-dimensional DRAM or other three-dimensional stacked devices. In particular, the semiconductor structure 50 according to the embodiments of the present disclosure has conductive pillars exposed from the backside, and the conductive pillars are also referred to as TSVs and may be used for vertical interconnection of different stacked layers.

Particularly, in FIG. 7, since the wafer 30 is in an inverted state, an upward plane of the wafer 30 in FIG. 7 is a "back plane of the wafer", and an upward end of the conductive pillar 31 is a "back end of the conductive pillar". In addition, the front side of the wafer 30 also has some bumps 32, which are relatively independent of the context of the embodiments of the present disclosure.

As mentioned above, depths of different conductive pillars are not consistent when the conductive pillars are initially formed. However, in the embodiments of the present disclosure, the back end of each conductive pillar is exposed, and the back ends of all conductive pillars are at the same height, so that the difficulty of subsequent interconnection process is reduced, and the stress concentration will not occur, thereby reducing the preparation difficulty of the semiconductor structure and improving the preparation yield of the semiconductor structure.

In some embodiments, the insulation layer 33 is used to realize side insulation of the conductive pillars, and thus the insulation layer 33 may be formed of an insulation material, such as silicon nitride, silicon oxide, silicon oxynitride, or the like.

It should be noted that the insulation layer 33 may be formed by depositing an insulating material through the CVD process, and the CVD has the advantages of high deposition purity and controllable deposition thickness.

Here, the insulation material includes at least silicon nitride, and may also be a material with insulating properties, such as, silicon oxide and silicon oxynitride.

It should be noted that the material of the filling layer 34 includes at least SOG. SOG is a liquid dielectric formed by mixing a solvent with a dielectric, and contains silicon dioxide ($SiO_2$) or a material with a structure close to $SiO_2$. SOG is usually used after the CVD process to flatten the deposition layer produced by CVD. SOG has good adhesion to a silicon substrate, silicon nitride deposition layer, silicon oxide deposition layer, ethyl silicate (TEOS), etc., and has strong trench filling ability and good step coverage. After the SOG material is spin coated, the solvent is evaporated by baking and annealing, and the SOG material is solidified and converted into solid $SiO_2$ with low solvent.

Taking SOG as an example, SOG is spin coated on the insulation layer 33, and after baking and annealing are performed on the wafer 30, the SOG may be solidified to form the filling layer 34. Specifically, after SOG is spin coated, the wafer 30 is heated to 80° C. by a hot plate and baked for 3 minutes, the wafer 30 continues to be heated to 150° C. and baked for 3 minutes, the wafer 30 continues to be heated to 250° C. and baked for 3 minutes, and then annealing process is performed on the wafer 30 at 420° C. for 30 minutes to form the filling layer 34. In such case, the filling layer 34 surrounds all the conductive pillars 31, and polishing is performed on the filling layer 34 and the conductive pillars 31, until the back end of each conductive pillar 31 is exposed from the back plane of the filling layer 34 and is flush with the back plane of the filling layer 34.

In this way, the filling layer 34 surrounds the conductive pillars 31. On the one hand, the filling layer 34 may protect the conductive pillars from being torn during the polishing process; on the other hand, the filling layer 34 may also isolate the falling conductive material from the wafer, so as to avoid the wafer (Si) being polluted by the falling conductive material (such as, Cu).

In some embodiments, the thickness of the wafer 30 is about 53-60 microns. In one example, the thickness of the wafer 30 may be 57 microns and the thickness of the insulation layer 33 is about 0.2-0.3 microns. The thickness of the filling layer 34 is 7.8-8 microns when the filling layer 34 is initially formed, and the final thickness of the filling layer 34 after polishing is about 0.8-1.2 microns.

The embodiments of the present disclosure provide a semiconductor structure, the conductive pillars are polished by means of the filling layer, not only the back end of each conductive pillar is exposed, but also the back ends of all conductive pillars are at the same height, so that the difficulty of subsequent interconnection process is reduced, and the stress concentration will not occur, thereby reducing the preparation difficulty of the semiconductor structure and improving the preparation yield of the semiconductor structure.

Figure 8:
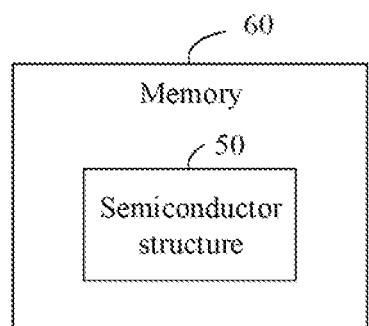
FIG. 8 is a schematic structural diagram of a memory according to an embodiment of the present disclosure.

In another embodiment of the present disclosure, referring to FIG. 8, a schematic structural diagram of a memory 60 according to an embodiment of the present disclosure is illustrated. As illustrated in FIG. 8, the memory 60 includes the semiconductor structure 50 described above, in which not only the back end of each conductive pillar is exposed, but also the back ends of all conductive pillars are at the same height, so that the difficulty of subsequent interconnection process is reduced, and the stress concentration will not occur, thereby reducing the preparation difficulty of the semiconductor structure and improving the preparation yield of the semiconductor structure.

In several embodiments provided in the present disclosure, it should be understood that the disclosed devices and methods may be implemented in a non-targeted manner. The device embodiments described above are only schematic, and for example, division of the units is only logic function division, and other division manners may be adopted during practical implementation. For example, multiple units or components may be combined or integrated into another system, or some characteristics may be neglected or not executed.

The features disclosed in some method or device embodiments provided in the disclosure may be freely combined without conflicts to obtain new method embodiments or device embodiments.

The above is only some implementations of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

What is claimed is:

1. A method for preparing a semiconductor structure, comprising:
   providing a wafer in which a plurality of conductive pillars are formed;
   inverting the wafer, and performing etching on a back plane of the wafer to expose each conductive pillar from the back plane of the wafer, wherein lengths of the plurality of conductive pillars exposed to the back plane are different;
   depositing an insulation layer on the back plane of the wafer and the conductive pillars, and depositing a filling layer on the insulation layer, wherein the filling layer completely covers back ends of the plurality of conductive pillars; and
   performing polishing on the filling layer and back ends of a part of the conductive pillars, until a back end of each conductive pillar is exposed and the back ends of the plurality of conductive pillars are flush with a back plane of the filling layer;
   wherein before etching is performed on the back plane of the wafer, a maximum length of the conductive pillars is a first value and a minimum length of the conductive pillars is a second value; and
   wherein performing etching on the back plane of the wafer to expose each conductive pillar from the back plane of the wafer comprises:
   performing thinning on the back plane of the wafer, wherein a thickness of the wafer subjected to thinning is a third value;
   performing chemical mechanical polishing on the back plane of the wafer, wherein a thickness of the wafer subjected to chemical mechanical polishing is a fourth value; and
   performing silicon etching on the back plane of the wafer, wherein a thickness of the wafer subjected to silicon etching is a fifth value;
   wherein the third value, the fourth value and the fifth value are decreased successively, the fourth value is greater than the first value, and the fifth value is less than the second value.

2. The method of claim 1, wherein depositing the insulation layer on the back plane of the wafer and the conductive pillars comprises:

depositing an insulation material on the back plane of the wafer and the conductive pillars by a chemical vapor deposition process, to form the insulation layer, wherein the insulation material comprises at least silicon nitride.

3. The method of claim 2, wherein a thickness of the insulation layer is less than a minimum length of the conductive pillars exposed to the back plane of the wafer.

4. The method of claim 1, wherein depositing the filling layer on the insulation layer comprises:

coating a filling material on the insulation layer by a spin coating process;

performing baking on the wafer; and performing an annealing process on the wafer, to enable the filling material to be solidified to form the filling layer;

wherein the filling material comprises at least spin-on glass (SOG).

5. The method of claim 4, wherein performing baking on the wafer comprises:

heating the wafer to a first temperature value by a hot plate and performing baking for a first preset duration;

heating the wafer to a second temperature value by the hot plate and performing baking for the first preset duration; and heating the wafer to a third temperature value by the hot plate and performing baking for the first preset duration.

6. The method of claim 5, wherein the first temperature value is less than the second temperature value, the second temperature value is less than the third temperature value, and a difference between the second temperature value and the first temperature value is less than that between the third temperature value and the second temperature value.

7. The method of claim 6, wherein a temperature of the annealing process is a fourth temperature value and a duration of the annealing process is a second preset duration; and wherein the fourth temperature value is greater than the third temperature value, and the second preset duration is longer than the first preset duration.

8. The method of claim 1, wherein inverting the wafer comprises:

providing a carrier; and inverting the wafer onto the carrier, and performing bonding on the wafer and the carrier.

9. The method of claim 1, wherein a difference between the third value and the fourth value is greater than that between the fourth value and the fifth value.

10. The method of claim 9, wherein a thickness of the insulation layer is 0.2-0.3 microns;

a thickness of the filling layer is 7.8-8 microns before polishing is performed on the filling layer and the back ends of the part of the conductive pillars; and the thickness of the filling layer is 0.8-1.2 microns after polishing is performed on the filling layer and the back ends of the part of the conductive pillars.

11. The method of claim 1, wherein after polishing is performed on the filling layer until the back end of each conductive pillar is exposed, the method further comprises:

forming a circuit structure on the back end of the conductive pillar.

12. A method for preparing a semiconductor structure, comprising:

providing a wafer in which a plurality of conductive pillars are formed;

inverting the wafer, and performing etching on a back plane of the wafer to expose each conductive pillar from the back plane of the wafer, wherein lengths of the plurality of conductive pillars exposed to the back plane are different;

depositing an insulation layer on the back plane of the wafer and the conductive pillars, and depositing a filling layer on the insulation layer, wherein the filling layer completely covers back ends of the plurality of conductive pillars; and performing polishing on the filling layer and back ends of a part of the conductive pillars, until a back end of each conductive pillar is exposed and the back ends of the plurality of conductive pillars are flush with a back plane of the filling layer;

wherein depositing the filling layer on the insulation layer comprises:

coating a filling material on the insulation layer by a spin coating process;

performing baking on the wafer; and performing an annealing process on the wafer, to enable the filling material to be solidified to form the filling layer;

wherein the filling material comprises at least spin-on glass (SOG);

wherein performing baking on the wafer comprises:

heating the wafer to a first temperature value by a hot plate and performing baking for a first preset duration;

heating the wafer to a second temperature value by the hot plate and performing baking for the first preset duration; and heating the wafer to a third temperature value by the hot plate and performing baking for the first preset duration;

wherein the first temperature value is less than the second temperature value, the second temperature value is less than the third temperature value, and a difference between the second temperature value and the first temperature value is less than that between the third temperature value and the second temperature value.

13. The method of claim 12, wherein depositing the insulation layer on the back plane of the wafer and the conductive pillars comprises:

depositing an insulation material on the back plane of the wafer and the conductive pillars by a chemical vapor deposition process, to form the insulation layer, wherein the insulation material comprises at least silicon nitride.

14. The method of claim 13, wherein a thickness of the insulation layer is less than a minimum length of the conductive pillars exposed to the back plane of the wafer.

* * * * *